United States Patent [19]

Petr et al.

[11] Patent Number: 5,640,085
[45] Date of Patent: Jun. 17, 1997

[54] TEMPERATURE COMPENSATION CIRCUIT

[75] Inventors: Jan Petr, Oberwil/Zug; Erich Jeker, Baar, both of Switzerland

[73] Assignee: Landis & Gyr Technology Innovation AG, Zug, Switzerland

[21] Appl. No.: 602,178

[22] Filed: Feb. 15, 1996

[30] Foreign Application Priority Data

Feb. 17, 1995 [CH] Switzerland ............................... 470/95

[51] Int. Cl.$^6$ ................................................. G01R 31/28
[52] U.S. Cl. ............................................ 324/105; 330/1 R
[58] Field of Search ................................ 324/105; 330/1, 330/9; 323/3, 4

[56] References Cited

U.S. PATENT DOCUMENTS

| | | |
|---|---|---|
| 3,735,274 | 5/1973 | Nelson ........................................ 330/1 |
| 3,886,435 | 5/1975 | Steckler ...................................... 323/4 |
| 5,493,078 | 2/1996 | Uchiiker ..................................... 177/212 |

OTHER PUBLICATIONS

*Electronics Letters*, 7 Jan. 82, vol. 18, No. 1, pp. 24 to 25, "Bandgap Voltage Reference Sources in CMOS Technology," by R. Ye and Y. Tsividis.

*Primary Examiner*—Kenneth A. Wieder
*Assistant Examiner*—Barry C. Bowser
*Attorney, Agent, or Firm*—Meltzer, Lippe, Goldstein, et al.

[57] ABSTRACT

A temperature compensation circuit for a power measurement device includes an input sensor, with a temperature-dependent transmission factor ($K_{H,T}$), connected to a signal processor with a temperature-dependent transmission factor ($K_{S,T}$). Transmission factor ($K_{S,T}$) of the signal processor is inversely proportional to a temperature-dependent reference voltage ($U_{R,N,T}$), which is inputted to the signal processor in order to render the combined transmission factor ($K_{H,T} \cdot K_{S,T}$) temperature independent. To accomplish this, a temperature coefficient value of reference voltage ($U_{R,N,T}$) must be equal to the sum of a temperature coefficient value of transmission factor ($K_{H,T}$) and a temperature coefficient value of transmission factor ($K_{S,T}$). The desired temperature coefficient value of reference voltage ($U_{R,N,T}$) is predetermined, and can be programmed into the inventive temperature compensation circuit, so as to accommodate variations in temperature coefficient characteristics of the internal components.

11 Claims, 2 Drawing Sheets

TEMPERATURE COMPENSATION CIRCUIT

FIELD OF THE INVENTION

The present invention relates to a temperature compensation circuit for a power measuring device. More specifically, the present invention relates to a temperature compensation circuit and process which can be automatically individualized with predetermined parameters.

BACKGROUND OF THE INVENTION

Temperature compensation circuits are frequently used in energy and/or output measuring instruments, such as electricity meters, in order to render the measurement results independent of temperature.

One known method of temperature compensation is the use of a resistance connected in parallel with a Hall element, where the temperature coefficient of the resistance compensates for the temperature coefficient of the Hall element. Also, from *Electronics Letters*, 7 Jan. 82, Vol. 18, No 1, pages 24 to 25, "Bandgap Voltage Reference Sources in CMOS Technology," by R. Ye and Y. Tsividis, an internal structure of a "bandgap" reference voltage source using CMOS technology is described, for use in temperature compensation applications.

It is an object of the present invention to provide a temperature compensation circuit and process which can accommodate temperature coefficient variations among different embodiments of the inventive circuit. It is a further object of the present invention to provide for individualized, rapid, low-cost, and automatically programmable temperature compensation.

SUMMARY OF THE INVENTION

In accordance with an illustrative embodiment of the present invention, a temperature compensation circuit includes a sensor which receives an input power signal to be measured. This input signal may, illustratively, be made up of a voltage signal and a current signal. The sensor converts the input power signal to an output signal (illustratively, a voltage signal), which is proportional to the power input signal to be measured.

The sensor output signal is inputted to a signal processor, which also receives a reference voltage input from a reference voltage source. The signal processor generates an output signal which represents a median value of the sensor output signal, which is also representative of a median value of the input power signal to be measured.

Temperature compensation of the above-described measurement is achieved when a temperature coefficient value of the reference voltage inputted to the signal processor is equal to the sum of the temperature coefficient values of the sensor and the signal processor, and when the temperature coefficient value of the signal processor is inversely proportional to that of the reference voltage.

For individualization of a particular temperature compensating circuit, the temperature coefficient value of the reference voltage is selected by a predetermined program value.

An illustrative embodiment of the present invention is more fully described below in conjunction with the following drawings.

DETAILED DESCRIPTION OF THE INVENTION

With regard to the aforementioned drawings, the parameters depending on a temperature T are designated by an index T, the parameters depending on an equalization value N are designated by an index N, and the parameters depending on the temperature T as well as on the equalization value N are given an index N,T. The symbol T designates an absolute temperature in degrees K.

Figure 1:
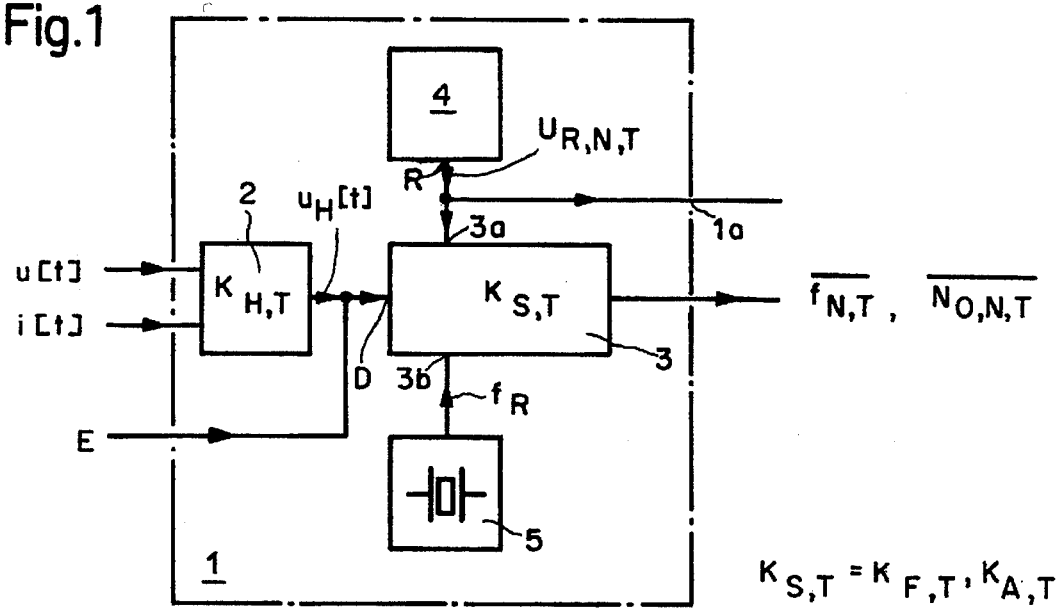
FIG. 1 shows a basic diagram of a temperature compensation circuit according to the invention.

According to a preferred embodiment of the invention, as shown in FIG. 1, an energy and/or output measuring device 1 includes a sensor 2 which measures an electrical current i[t], depending on a time t and a corresponding time-dependent electrical voltage u[t]. The current i[t] is, illustratively, an alternating current, and voltage u[t] is an alternating voltage. Sensor 2 has, typically, a temperature-dependent transmission factor $K_{H,T}$. Sensor 2 is, illustratively, a Hall element (designated by the index H), which is located in an air gap of a magnetic circuit of a U-shaped current loop (not shown in FIG. 1). Voltage u[t] is connected via a pre-resistance (not shown) to an input of the Hall element, while current i[t] flows through the U-shaped current loop. The output voltage $U_H[t]$ of sensor 2 is proportional to the product u[t]·i[t], which is an analog value of the power to be measured p[t], corresponding to the current i[t]. Sensor 2 is thereby a circuit for the detection of the analog value of p[t], which is designated $U_H[t]$. Sensor 2 then outputs voltage $U_H[t]$ to a signal processor 3. Signal processor 3 has, typically, a temperature-dependent transfer factor $K_{S,T}$. According to the invention, the combined temperature-dependent transmission factor $K_{H,T} \cdot K_{S,T}$ of sensor 2 and signal processor 3 is to be made independent of temperature change. For this purpose, transmission factor $K_{S,T}$ of signal processor 3 is, according to the invention, inversely proportional to a temperature-dependent reference voltage $U_{R,N,T}$ of a reference voltage source 4, which is located within the same temperature environment (T) as sensor 2 and signal processor 3. Signal processor 3 receives reference voltage $U_{R,N,T}$ via a first reference signal input 3a from an output R of reference voltage source 4. Output R also constitutes a reference voltage output 1a of energy and/or output measuring device 1, upon which reference voltage $U_{R,N,T}$ appears. A reference frequency generator 5, in which a reference frequency $f_R$ is produced, feeds an impulse signal of reference frequency $f_R$ to signal processor 3 via a second reference signal input 3b.

Signal processor 3 is preferably a voltage/frequency transformer, where $K_{S,T}=K_{F,T}$. In this case, a median output frequency $\overline{f_{N,T}}$ of signal processor 3 is proportional to a median value $\overline{U_H[t]}$ of output voltage $\overline{U_H[t]}$ of sensor 2, and is therefore proportional to a median value $\overline{p[t]}$ of the power to be measured p[t].

In an alternate embodiment, signal processor 3 may be an analog-to-digital converter, where $K_{S,T}=K_{A,T}$. In this case, a digital median output value $\overline{N_{O,N,T}}$ of signal processor 3 is proportional to median value $U_H[t]$ of signal $U_H[t]$, and in turn, to median value $p[t]$ of signal $p[t]$.

The following equations apply to sensor 2:

$$\overline{U_H[t]} = K_{H,T}\overline{u[t] \times i[t]} = K_{H,T}\overline{p[t]} \quad [I]$$

where $$K_{H,T} = K_{H,O} \cdot \{1 + \alpha_H \Delta T\} = K_{H,O} + \alpha_H \cdot \Delta T$$

and $$a_H = K_{H,O}\alpha_H,$$

and where:

$K_{H,O}$ is a value of $K_{H,T}$ at a reference temperature $T_0$.

$\Delta T$ is a difference between the temperature $T$ and the reference temperature $T_0$, $a_H$ is an absolute temperature coefficient of the transmission factor $K_{H,T}$ and $\alpha_H$ is a relative temperature coefficient of the transmission factor $K_{H,T}$.

Where signal processor 3 is a voltage/frequency transformer, the following equations apply, whereby a term of the second order is disregarded:

$$\begin{aligned}\overline{f_{N,T}} &= K_{F,T} \cdot \overline{U_H[t]} = K_{F,T} \cdot K_{H,T} \cdot \overline{p[t]} = \{K_{H,T} \cdot M_{F,T} f_R / 51 U_{R,N,T}\} \cdot \overline{p[t]} \\ &= \{K_{H,O} \cdot M_{F,O} \cdot f_R \cdot [1 + \alpha_H \cdot \Delta T][1 + \alpha_F \Delta T]/U_{R,N,T}\} \cdot \overline{p[t]} \\ &= \{K_{H,O} \cdot M_{F,O} \cdot f_R \cdot [1 + (\alpha_H + \alpha_F) \cdot \Delta T]/U_{R,N,T}\} \cdot \overline{p[t]} \end{aligned}$$

where $$\begin{aligned} K_{F,T} &= M_{F,T} \cdot f_R/U_{R,N,T} \\ M_{F,T} &= M_{F,O} \cdot \{1 + \alpha_F \Delta T\} = M_{F,O} + a_F \Delta T \\ a_F &= M_{F,O} \cdot \alpha_F \end{aligned} \quad [III]$$

Where signal processor 3 is an analog-to-digital converter, the following equations apply, whereby a term of the second order is disregarded:

$$\begin{aligned}\overline{N_{O,N,T}} &= K_{A,T} \cdot \overline{U_H[t]} = K_{A,T} \cdot K_{H,T} \cdot \overline{p[t]} = \{K_{H,T} \cdot M_{A,T} \cdot A/U_{R,N,T}\} \cdot \overline{p[t]} \\ &= \{K_{H,O} \cdot M_{A,O} \cdot A \cdot [1 + \alpha_H \cdot \Delta T][1 + \alpha_A \Delta T]/U_{R,N,T}\} \cdot \overline{p[t]} \\ &= \{K_{H,O} \cdot M_{A,O} \cdot A \cdot [1 + (\alpha_H + \alpha_A) \cdot \Delta T]/U_{R,N,T}\} \cdot \overline{p[t]} \end{aligned}$$

where $$\begin{aligned} K_{A,T} &= M_{A,T} \cdot \{f_R/f_p\}/U_{R,N,T} = M_{A,T} \cdot A/U_{R,N,T} \\ f_R/f_p &= A \\ M_{A,T} &= M_{A,O} \cdot \{1 + \alpha_A \Delta T\} = M_{A,O} + a_A \Delta T \\ a_A &= M_{A,O} \cdot \alpha_A \end{aligned} \quad [IIIa]$$

The following equations apply to the temperature-dependent reference voltage $U_{R,N,T}$:

$$U_{R,N,T} = U_{R,N,O}(1 + \alpha_{R,N}\Delta T) = U_{R,N,O} + \alpha_{R,N} \cdot \Delta T \quad [IV]$$

where $$a_{R,N} = U_{R,N,O}\alpha_{R,N} \quad [V]$$

and where $M_{F,T}$ and $M_{A,T}$ are two temperature-dependent proportionality constants;

$U_{R,N,O}$, $M_{F,O}$ and $M_{A,O}$ are values of $U_{R,N,T}$, $M_{F,T}$ and $M_{A,T}$ at a reference temperature $T_0$;

$\alpha_{R,N}$ is a relative temperature coefficient of the reference voltage $U_{R,N,T}$;

$\alpha_F$ and $\alpha_A$ are relative temperature coefficients of the proportionality constants $M_{F,T}$ and $M_{A,T}$, and thereby relative temperature coefficients of the transmission factor $K_{F,T}$ or $K_{A,T}$, when the reference voltage $U_{R,N,T}$ is temperature-dependent; i.e., they are relative temperature coefficients of signal processor 3 when output measuring device 1 is not temperature compensated;

$a_{R,N}$ is an absolute temperature coefficient of the reference voltage $U_{R,N,T}$;

$a_F$ and $a_A$ are absolute temperature coefficients of proportionality constants $M_{F,T}$ and $M_{A,T}$, and thereby absolute temperature coefficients of transmission factors $K_{F,T}$ or $K_{A,T}$, when reference voltage $U_{R,N,T}$ is temperature-dependent; i.e., they are absolute temperature coefficients of signal processor 3 when output measuring device 1 is not temperature compensated;

and $f_p$ is a data rate of the digital output value of the analog-to-digital converter.

In order to achieve temperature compensation, according to the invention, a desired value $\alpha_{R,N,Soll}$ of temperature coefficient $\alpha_{R,N}$, of temperature-dependent reference voltage $U_{R,N,T}$, must be equal to a sum of temperature coefficient $\alpha_H$, of transmission factor $K_{H,T}$ of sensor 2, and either temperature coefficient $\alpha_F$ or $\alpha_A$, of transmission factor $K_{F,T}$ or $K_{A,T}$, respectively, of signal processor 3. The following therefore applies for temperature compensation:

$$a_{R,N,Soll} = \alpha_H + \alpha_F \quad [V]$$

or $$\alpha_{R,N,Soll} = \alpha_H + \alpha_A$$

In the voltage/frequency transformer case, the median output frequency $\overline{f_{N,T}}$ is independent of temperature, as follows:

$$\begin{aligned}\overline{f_{N,T}} &= \{K_{H,O} \cdot M_{F,O} \cdot f_R \cdot [1 + (\alpha_H + \alpha_F) \cdot \Delta T]/U_{R,N,T}\} \cdot \overline{p[t]} \\ &= \{K_{H,O} \cdot M_{F,O} \cdot f_R \cdot [1 + (\alpha_H + \alpha_F) \cdot \Delta T]/U_{R,N,O}(1 + \alpha_{R,N,Soll} \cdot \Delta T)]\} \cdot \overline{p[t]} \\ &= \{K_{H,O} \cdot M_{F,O} \cdot f_R / U_{R,N,O}\} \cdot \overline{p[t]} \end{aligned}$$

For the analog-to-digital converter case, the digital median value $\overline{N_{O,N,T}}$ is independent of temperature, as follows:

$$\begin{aligned}
\overline{N_{O,N,T}} &= \{K_{H,O} \cdot M_{A,O} \cdot A \cdot [1 + (\alpha_H + \alpha_A) \cdot \Delta T]/U_{R,N,T}\} \cdot \overline{p[t]} \\
&= \{K_{H,O} \cdot M_{A,O} \cdot A \cdot [1 + (\alpha_H + \alpha_H) \cdot \Delta T]/U_{R,N,O} \cdot (1 + \alpha_{R,N,Soll} \cdot \Delta T)]\}\overline{p[t]} \\
&= \{K_{H,O} \cdot M_{A,O} \cdot A \cdot /U_{R,N,O}\}\overline{p[t]}
\end{aligned}$$

The relative temperature coefficient $\alpha_H$ of sensor 2 (e.g., with a Hall element) has an empirically obtained median value of 765 ppm/°K., whereby the temperature coefficient of the magnetic circuit is also taken into account.

The relative temperature coefficient $\alpha_F$ of the voltage/frequency transformer has, illustratively, an empirically obtained median value of −30 ppm/K. In order to obtain a more precise value, taking into account the dispersions from one unit to another, it is preferably determined by means of a two-temperature measurement of median output frequency $\overline{f_{N,T}}$ of measuring device 1. In this case, output frequency $\overline{f_{N,T}}=\overline{f_{0,35}}$ with a first temperature, e.g., at a reference temperature $T_0=35°$ C., and output frequency $\overline{f_{N,T}}=\overline{f_{0,85}}$ at a second temperature $T_1$, illustratively at 85° C., measured in each case with, e.g., N=0. The difference $\Delta T=(T_1-T_0)$ between the two temperatures $T_1$ and $T_0$ should be at least 50° C. in this case. Furthermore, the reference voltage $U_{R,N,T}=U_{R,O,85}$ or $U_{R,N,T}=U_{R,O,35}$, also with N=0, is measured at the two temperatures $T_1$ and $T_0$. Measuring device 1, with the exception of sensor 2, is preferably made in the form of an integrated semiconductor circuit. The measurements and subsequent programming then preferably take place during "wafer" test measurements; i.e., at a point in time when sensor 2 is not yet available, and is not yet connected to signal processor 3. An input D of signal processor 3 (see FIG. 1), which is at the same time an input E of measuring device 1, is therefore supplied by a direct voltage $U_H$ of known value, instead of by output voltage $U_H[t]$ of sensor 2. Equations [I] and [II] then produce the following:

$$U_H = K_{H,T}\overline{p[t]}$$

$$M_{F,T}=[\overline{f_{N,T}} \cdot U_{R,N,T}]/[f_R \cdot K_{H,T}\overline{p[t]}]=[\overline{f_{N,T}} \cdot U_{R,N,T}]/[f_R \cdot U_H],$$

which produces two equations in the case of a two-temperature measurement:

$$M_{F,85}=[\overline{f_{0,85}} \cdot U_{R,0,85}]/[f_R \cdot U_H],$$

$$M_{F,35}=[\overline{f_{0,35}} \cdot U_{R,0,35}]/[f_R \cdot U_H],$$

whereby the reference frequency $f_R$ is previously known.

The equation [III] then produces the following:

$$\alpha_F=[M_{F,85}-M_{F,35}]/[M_{F,35}\Delta T]$$

where $\Delta T=50°$ C.

If signal processor 3 is an analog-to-digital converter, equation [IIIa] similarly produces the following:

$$\alpha_A=[M_{A,85}-M_{A,35}]/[M_{A,35}\Delta T]$$

where $\Delta T=50°$ C.

Since the temperature coefficients are subjected to strong dispersions from one temperature compensating circuit to another, equation $\alpha_{R,N,Soll}=\alpha_H+\alpha_F$ or $\alpha_{R,N,Soll}=\alpha_H+\alpha_A$ must be adjusted individually for each circuit. For this purpose, the value $\alpha_{R,N,Soll}$ of temperature coefficient $\alpha_{R,N}$ of temperature-dependent reference voltage $U_{R,N,T}$, which is necessary for temperature compensation, can be programmed individually for each circuit, and preferably by means of a digital equalization value N, which may be stored in non-volatile memory (see memory 38 in FIG. 3), so as to be equal to the sum of relative temperature coefficient $\alpha_H$ of transmission factor $K_{H,T}$ of the appertaining sensor 2, and relative temperature coefficient $\alpha_F$ or $\alpha_A$, of transmission factor $K_{F,T}$ or $K_{A,T}$, respectively, of the appertaining signal processor 3 of an uncompensated output measuring device 1.

Figure 2:
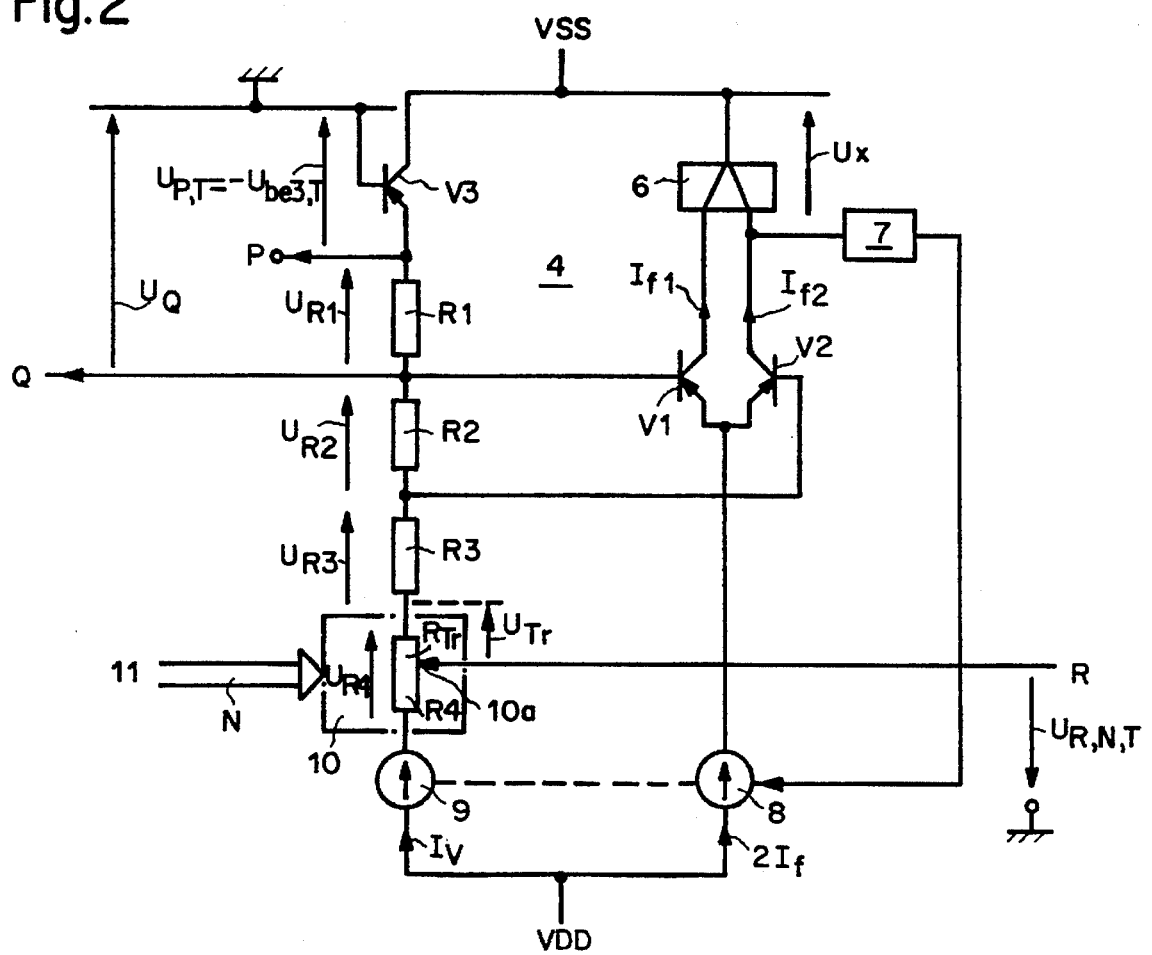
FIG. 2 shows a simplified schematic diagram of a reference voltage source according to the invention.

Reference voltage source 4 is shown in block diagram form in FIG. 2. Reference voltage source 4 is preferably a "bandgap" reference voltage source, in which a temperature-independent first reference voltage $U_Q$, a temperature-dependent second reference voltage $U_{R,N,T}$, and a temperature-dependent third reference voltage $U_{P,T}$ are produced. All three reference voltages are referenced to ground, with voltage $U_Q$ going to output Q, voltage $U_{R,N,T}$ going to output R, and voltage $U_{P,T}$ going to measuring point P. The values of reference voltage $U_{R,N,T}$ and its temperature coefficient $a_{R,N,T}$ depend on a temperature T, and can be programmed by means of digital equalization value N.

In FIG. 2, transistors V1, V2 and V3 may be either NPN or PNP bipolar transistors. In the embodiment described below, the latter instance is assumed. Reference voltage source 4 preferably contains a current mirror 6, whose first connection goes to a collector of a first transistor V1, and whose second connection is connected to a collector of a second transistor V2. This second connection also feeds through a servo-amplifier 7, to a control input of a first and a second current source 8 and 9. A third connection of current mirror 6 is connected preferably to a grounded negative direct voltage VSS. The emitters of transistors V1 and V2 are connected to each other and, via current source 8 which supplies both emitters jointly, to a grounded positive direct voltage VDD. Transistors V1 and V2 serve, among other things, as an input step of servo-amplifier 7, holding the effective zero voltage (offset voltage) of the latter down; (i.e., at less than 1 mV). This is important because a desired signal $\Delta U_{be}$, used in reference voltage source 4, has only a relatively low value of 50 to 60 Mv. A base/emitter path of transistor V3, a resistance R1, a resistance R2, a resistance R3, an overall resistance R4 of a trimming potentiometer 10, and current source 9 are connected in series as indicated in FIG. 2. Resistances R3 and R4 are thus placed in a series connection between current source 9 and resistance R2, with resistance R4 being located between resistance R3 and current source 9. The emitter of transistor V3 is connected to resistance R1 so as to form a series connection V3;R1;R2;R3;R4;9, with measuring point P connected at the junction of V3 and R1. The base of transistor V3 is grounded, while the collector of transistor V3 is connected to negative direct voltage VSS, in a preferred embodiment. The base of transistor V3 constitutes a first grounded connection of series connection V3;R1;R2;R3;R4;9. A connection of current source 9, which is not connected directly to trimming potentiometer 10, constitutes a second connection of series connection V3;R1;R2;R3;R4;9, and is connected to positive direct voltage VDD. A common connection of resistances R1 and R2 is connected to the base of transistor V1, and constitutes output Q of reference voltage source 4. A common connection of resistances R2 and R3 is connected to the base of transistor V2. The two connections of resistance R2 are thus each connected to a base of transistors V1 and V2. A tap 10a of trimming potentiometer 10 constitutes an output R, representing temperature-dependent reference voltage $U_{R,N,T}$. A current $I_V$ of current source 9 is regulated in such manner by means of servo-amplifier 7 that collector currents $I_{f1}$ and $I_{f2}$ of transistors V1 and V2 are always equal, so that $I_{f1}=I_{f2}=I_f$. The two current sources 8 and 9 are coupled together so that their two currents $2I_f$ and $I_V$ are proportional with respect to each other.

If, for example, collector current $I_{f2}$ of transistor V2 is too low, the value of the voltage drop $U_x$ falls beyond the current mirror 6, which is at the same time the input voltage of servo-amplifier 7, causing current $I_V$ of current source 9 to be reduced, since $I_V$ is proportional to $G \cdot U_x$, G being an amplification factor of servo-amplifier 7. As a result of the reduced voltage drop via R1 and R2, the base-emitter voltage $U_{be2}$ of transistor V2 rises, so that its collector current $I_{f2}$ rises again.

For the transistor V1, the following equations apply:

$$I_{C1} = I_{S1} \cdot e^{[q/KT] \cdot U_{be1}}$$
$$U_{be1} = [KT/q] \cdot \ln[I_{C1}/I_{S1}]$$
$$I_{S1} = [q \cdot n_i^2 \cdot D/N_B] \cdot A_1$$

where $I_{C1}$ is the collector current, $U_{be1}$ the base-emitter voltage, $I_{S1}$ the theoretical off-state current of the base/emitter path, and $A_1$ the emitter surface of the transistor V1.

In general, the following furthermore applies:

$K=1.380066 \cdot 10^{-23}$ J/K (the Boltzmann constant), $q=1.60212 \cdot 10^{-19}$ Coulomb (the elementary charge of an electron), $n_i=2 \cdot 10^{11}$ cm$^{-3}$ (the "intrinsic" inertial density), D=the diffusion constant in cm$^2$ per second, and $N_B=2.5 \cdot 10^{16}$ cm$^{-3}$ (the "bulk" doping).

For transistor V2, the following equations apply:

$$I_{C2} = I_{S2} \cdot e^{[q/KT] \cdot U_{be2}}$$
$$U_{be2} = [KT/q] \cdot \ln[I_{C2}/I_{S2}]$$
$$I_{S2} = [q \cdot n_i^2 \cdot D/N_B] \cdot A_2$$

where $I_{C2}$ is the collector current, $U_{be2}$ the base-emitter voltage, $I_{S2}$ the theoretical off-state current of the base/emitter path, and $A_2$ the emitter surface of transistor V2.

The difference formation of a voltage drop $U_{R2}$ across resistance R2 yields the following equation:

From the last equation, it can be seen that $\Delta U_{be}$ depends only on physical constants K and q, and on the current density ratio $[I_{C1}/A_1]/[I_{C2}/A_2]$, in addition to absolute temperature T.

Transistor V2 consists, illustratively, of eight identical transistors of type V1, whereby each of the latter has a collector current $I_{C1}/8$, as the collector currents $I_{C1}$ and $I_{C2}$ of transistors V1 and V2 are equal. $A_2$ is thus $8A_1$. This results in:

$$U_{R2}=\Delta U_{be}=[K \cdot T/q] \cdot \ln 8$$

$$I_V=U_{R2}/R2=\{[K \cdot T]/[q \cdot R2]\} \ln 8 \quad [VI]$$

The current $I_V$ of second current source 9 is thus proportional to absolute temperature T, and has a positive temperature coefficient. Disregarding the base currents of transistors V1 and V2, current source 9 supplies current $I_V$ to resistances R1 to R4. Since the temperature coefficient of resistances R1 to R4, which are made in the form of poly-silicone semiconductor resistances, is small, the voltage drops $U_{R1}$, $U_{R2}$, $U_{R3}$ and $U_{R4}$, caused by current $I_V$, have a positive temperature coefficient due to current $I_V$, and can therefore be used for the compensation of a negative temperature coefficient; e.g., that of the base/emitter path of transistor V3. Thus, a negative temperature coefficient of a base-emitter voltage $U_{be3,T}$ of transistor V3, and a positive temperature coefficient voltage drop produced in poly-silicon semiconductor resistance R1;R2;R3;R4 by means of current $I_V$, are thus combined in such manner that temperature-dependent reference voltage $U_{R,N,T}$ has the value $\alpha_{R,N,Soll}$ (see equation [V]) of temperature coefficient $\alpha_{R,N}$, which is the value required for temperature compensation. In this case, the base/emitter path of transistor V3, with the base-emitter voltage $U_{be3,T}$, poly-silicone semiconductor resistance R1;R2;R2;R4, and second current source 9 are connected electrically in series. Poly-silicone semiconductor resistance R1;R2;R3;R4 contains several resistances connected electrically in series; i.e., the four resistances R1 to R4. The nearly linear, and also process-independent voltage drops $U_{R1}$, $U_{R2}$, $U_{R3}$ and $U_{R4}$ are provided with a positive temperature coefficient by means of current $I_V$, whereby current $I_V$ (with positive temperature coefficient) is produced by the difference $\Delta U_{be}$ between base-emitter voltages $U_{be1}$ and $U_{be2}$ of transistors V1 and V2, operated with different current densities $I_{C1}A_1$ and $I_{C2}/A_2$ in a differential circuit.

At a room temperature of 300° K., $U_{R2}=\Delta U_{be}=53.8$ mV, and is therefore small.

The base-emitter voltage $U_{be}$ of each bipolar transistor, and thereby also the base-emitter voltage $U_{be3,T}$ of transistor V3, is dependent in a nearly linear manner on absolute temperature T, so that the following equation applies for transistor V3:

$$U_{be3,T}=U_{Gap}-\lambda \cdot T=-U_{P,T} \quad [VII]$$

$$\begin{aligned}\Delta U_{be} = \Delta U_{be1} - U_{be2} &= [KT/q] \cdot \{\ln[I_{C1}/I_{S1}] - \ln[I_{C2}/I_{S2}]\} = [KT/q] \cdot \ln\{[I_{C1}/I_{C2}] \cdot [I_{S2}/I_{S1}]\} \\ &= [KT/q] \cdot \ln\{I_{C1}/I_{C2}] \cdot [A_2/A_1]\} = U_{R2}\end{aligned}$$

Here, ($U_{Gap}$=1.2 V) designates the extrapolated "bandgap" voltage and ($\lambda$=2.27 mV/°K.) designates the absolute value of the temperature coefficient of the base-emitter voltage $U_{be,T}$ of a bipolar transistor. Thus, a bipolar transistor has a relatively large negative temperature coefficient of −2.27 mV/°K. At a room temperature T=300° K., the voltage $U_{P,T}=U_{be3,T}$ appearing at measuring point P is approximately equal to 0.58 Volt. In order to compensate for the relatively great temperature dependency of $U_{be3,T}$, a second voltage ($U_{R1}$=R1·$I_V$) is added in the series connection V3;R1;R2;R3;R4;9 to base-emitter voltage $U_{be3,T}$ (with negative temperature coefficient), said added voltage, as already mentioned, having a positive temperature coefficient. The voltage drop $U_{R2}=\Delta U_{be}$ cannot be used for this purpose despite its positive temperature coefficient, because its relatively small value of approximately 53.8 mV is insufficient for the compensation of the negative temperature coefficient of the base/emitter path of transistor V3, and must be reinforced by a factor 12.5, which is done by means of resistance R1, which is selected for this purpose to be equal to 12.5·R2. The voltage drop $U_{R1}$ is then nearly equal to 0.672 Volt, and thereby in the same order of magnitude as the value $U_{be3,T}$=0.58 Volt.

Temperature-independent voltage $U_Q$, which appears at output Q of reference voltage source 4, is determined as follows, using equations [VI] and [VII]:

$$\begin{aligned} U_Q &= U_{R1} + U_{be3,T} = I_V \cdot R1 + [U_{Gap} - \lambda \cdot T] = [\Delta U_{be}/R2] \cdot R1 + [U_{Gap} - \lambda \cdot T] \\ &= [R1/R2] \cdot [\{K \cdot T/q\}\ln 8] + [U_{Gap} - \lambda \cdot T] \end{aligned}$$

To produce a reference voltage $U_Q$ independent of temperature, resistance R1, provided in the series connection between the base/emitter path of transistor V3 and resistance R2, must be sized so that the two temperature coefficients of $U_{R1}$ and $U_{be3,T}$ cancel each other out, resulting in an overall temperature coefficient close to zero; i.e., in order to meet the condition for $\lambda$=2.27 mV/°K., the following equation must be realized:

$$dU_Q/dT=[R1/R2]\cdot[K/q]\cdot \ln 8 - \lambda = 0$$

or $$R1/R2=\lambda/\{[K/q]\cdot \ln 8\}=12.5$$

The value 12.5 of the resistance ratio (R1/R2) can be set very precisely by means of poly-silicon semiconductor resistances adapted to each other. The voltage $U_Q$ is 1.25 V±5%, and its temperature coefficient is ±100 ppm/°K. The output resistance of output Q of reference voltage source 4 is relatively great, and the maximum output current correspondingly relatively small.

The principle described above can also be used in order to produce the temperature-dependent reference voltage $U_{R,N,T}$, whose temperature coefficient $a_{R,N,T}$ can be set, (i.e., programmed), by means of the digital equalization value N in a predetermined area. To accomplish this, current $I_V$ flowing through resistances R1 and R2 is again used, producing additional voltage drops $U_{R3}$ and $U_{R4}$ in resistances R3 and R4, respectively, which are used in whole or in part to produce $U_{R,N,T}$.

A programming bus input 11 of reference voltage source 4 constitutes a digital programming input to trimming potentiometer 10, which is a digital potentiometer in this embodiment. Digital equalization value N, which is assumed to have five bits, is brought to this programming input. Thus, 32 equalization values (0 to 31) are possible. In that case, resistance R4 of trimming potentiometer 10 consists preferably of 31 small resistances (each of value R5) of equal size, and connected in series, whose voltage drops produced by current $I_V$ are tapped, partially added up, and transmitted to tap 10a of trimming potentiometer 10, via a plurality of switches (not shown in FIG. 2). These are preferably 31 switch-over switches; e.g., by switching over each switch-over switch with one bit of digital equalization value N. Programming thus takes place within trimming potentiometer 10 by switching over voltage tap 10a of trimming potentiometer 10 from a common connection of two resistances R5 in a row to another common connection of two resistances R5 in a row. In complementary representation a digital 5-bit value 00000 represents preferably a value N=31, a digital 5-bit value 10000 represents a value N=15, and a digital 5-bit value 11111 represents a value N=0. The portion of resistance R4 located between tap 10a of trimming potentiometer 10 and the common connection of resistances R3 and R4 shall be designated hereinafter as trimming resistance $R_{Tr}$=N·R5, and can be set by means of equalization value N. Trimming resistance $R_{Tr}$ corresponds to a trimming voltage $U_{Tr}=R_{Tr}\cdot I_V$=N·R5·$I_V$, where N=0 to 31. While disregarding the base currents of transistors V1 and V2, and taking into consideration equations [VI] and [VII], the following applies for the voltage produced at tap 10a, and thereby at output R:

$$\begin{aligned} U_{R,N,T} &= U_{be3,T} + U_{R1} + U_{R2} + U_{R3} + U_{Tr} \\ &= U_{be3,T} + [R1 + R2 + R3 + N \cdot R5] \cdot I_V \\ &= [U_{Gap} - \lambda \cdot T] + [R1 + R2 + R3 + N \cdot R5] \cdot [\Delta U_{br}/R2] \\ &= [U_{Gap} - \lambda \cdot T] + \{[R1 + R2 + R3 + N \cdot R5]/R2\} \cdot [K/T/q] \cdot \ln 8 \end{aligned}$$

The temperature coefficient of $U_{R,N,T}$ is then:

$$a_{R,N,T}=dU_{R,N,T}/dT=-\lambda+[[R1+R2+R3+N\cdot R5]/R2]\cdot[K/q]\cdot \ln 8$$

The reference voltage $U_{R,N,T}$ which appears at tap 10a of trimming potentiometer 10, and its temperature coefficient $a_{R,N,T}$ can thus be set digitally by means of equalization value N. This is used in the temperature coefficient equalization process by programming temperature coefficient $a_{R,N,T}$ in such manner with N that equation [V] applies. Since the resistance ratio (R1/R2=12.5) is already known from the computation of $dU_Q/dT=0$, only the resistance ratios (R3/R2) and ($R_T$/R2=N·R5/R2) remain to be determined. R3 is sized so that temperature coefficient $a_{R,N,T}$ has the smallest value $a_{R,N,Sol,min}$ to be programmed when N=0. In that case, ([R3+R1]/R2=17.5) applies, for example. The maximum trimming resistance $R_{Tr,max}=N_{max}·R5=31·R5$ is sized so that temperature coefficient $a_{R,N,T}$ at $N=N_{max}=31$ has the highest value $a_{R,N,Sol,max}$ to be programmed. When digital equalization value N has five bits, a temperature coefficient range from 600 to 900 ppm/°K. can be set for $a_{R,N,T}$. The equalization is then preferably carried out during the wafer test. Reference voltage $U_{R,N,T}$ is also changed by programming; i.e., with approximately 5.5 mV per bit. Thus, for example, reference voltage $U_{R,N,T}$ is nearly 1.52 Volt at room temperature and N=0, and nearly 1.69 Volt at N=31.

Figure 3:
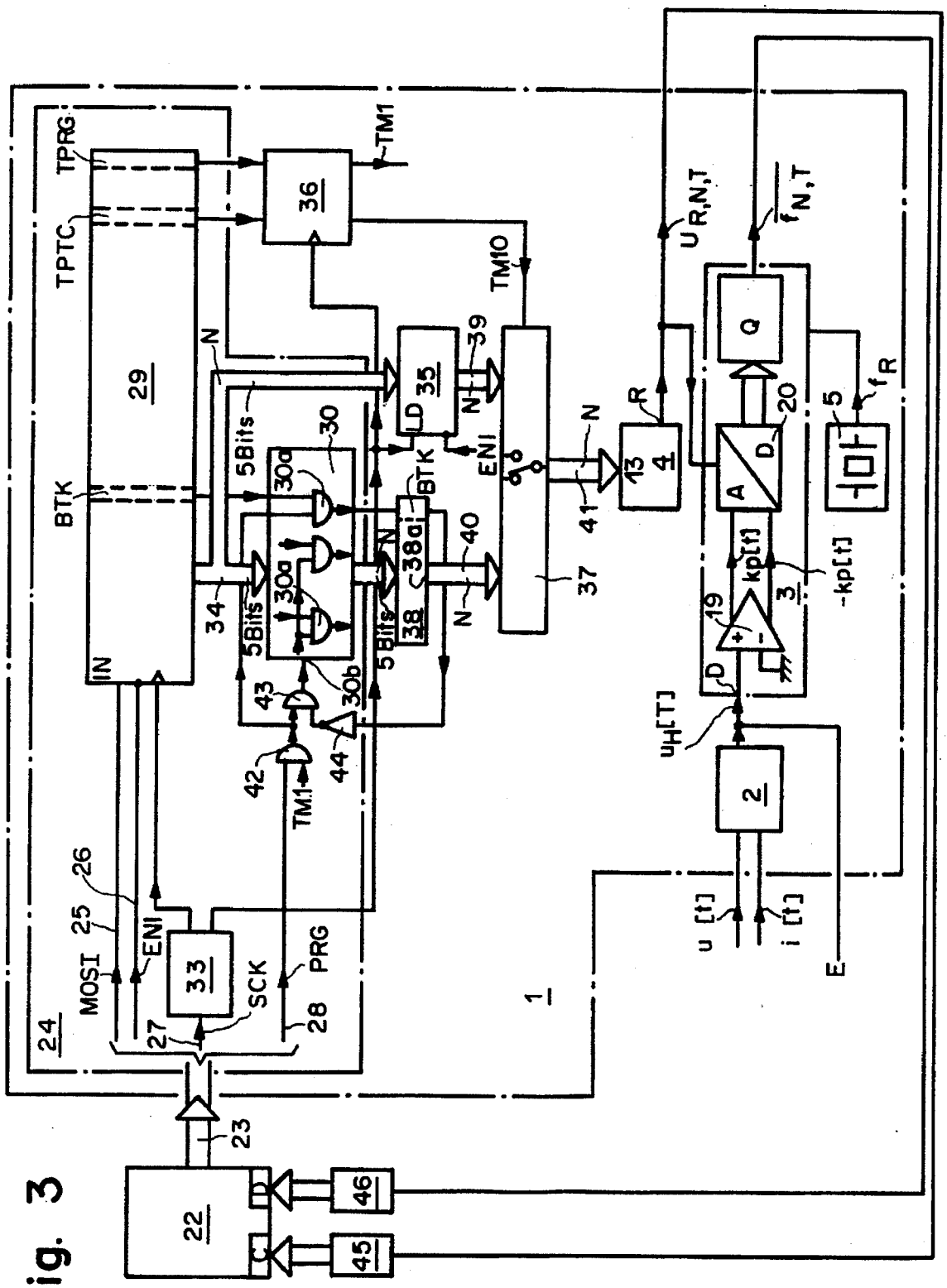
FIG. 3 shows a partial schematic diagram of an energy and/or output measuring device with an external measuring system and an external computer.

Referring now to FIG. 3, a Master/Slave arrangement is shown, in which a computer 22 is the Master, and a temperature compensated output measuring device 1 is the Slave.

In FIG. 3, it is assumed that signal processor 3 functions as a voltage/frequency transformer. Signal processor 3 contains an amplifier 19, whose two counter-clocking outputs are each connected to one of two inputs of an analog-to-digital converter 20, whose output is connected via a bus connection to a digital input of a quantizer Q. An output of quantizer Q constitutes an output of signal processor 3, which is at the same time an output of output measuring device 1. A non-inverted input of amplifier 19 constitutes an input D of signal processor 3, which is at the same time an input E of output measuring device 1. Input D is connected to the output of sensor 2, while an inverted input of amplifier 19 is grounded. A reference voltage $U_{R,N,T}$, supplied by a reference voltage source 4, is transmitted to a reference signal input of analog-to-digital converter 20. Reference voltage source 4 is spatially arranged so that it is within the same temperature environment as sensor 2 and signal processor 3. A reference frequency generator 5 (e.g., a quartz oscillator), supplies a second reference signal input to signal processor 3 with a clocking signal of frequency $f_R$. The two output signals of amplifier 19 are performance proportional and equal (+k·p[t] and -k·p[t]), where k is a proportionality constant. At the output of analog-to-digital converter 20, digitized values of the averaged performance signals +k·p[t] and -k·p[t] are present, these values having, illustratively, 22 bits, and are then quantized in a quantizer Q. That is, they are constantly added up (accumulated) and are broken down into constant quantums. Every time the sum in the accumulator exceeds a certain value, a constant number (quantum) is deducted from the sum and an output impulse is produced at the same time at the output of quantizer Q. These output impulses have a median frequency $\overline{f_{N,T}}$, which depends on an equalization value N and on a temperature T.

An external computer 22, preferably a microcomputer, is connected via an interface bus connection 23 to output measuring device 1, or more precisely, to an interface logic 24 at that location. Interface bus connection 23 and interface logic 24 constitute together a serial communications interface 23;24, which is preferably a standardized interface. In this case, interface bus connection 23, illustratively, contains a conductor 25 for the transmission of a data signal MOSI (Master Out, Slave In), a conductor 26 for the transmission of an enable interface signal ENI, a conductor 27 for the transmission of an interface clocking signal SCK, and a conductor for the transmission of a programming impulse PRG, from computer 22 to measuring device 1. Data signal MOSI has, e.g., 32 bits, of which five bits, illustratively from the fourteenth to the eighteenth bit, are the five bits of digital equalization value N. Furthermore, data signal MOSI also contains bit values of at least three additional bits TPRG, TPTC and BTK, e.g., as first, or tenth, or thirteenth bit. Interface logic 24 also contains a shift register 29, a programming release arrangement 30, and a counter 33 equipped with start/stop logic. Shift register 29 has the same number of bits, i.e., 32 bits, as data signal MOSI. The latter is transmitted via conductor 25 to a serial input IN of shift register 29. Interface clocking signal SCK feeds a clocking input to shift register 29 via conductor 27 and counter 33. The five parallel outputs of shift register 29 belonging to the five bits of digital equalization value N are connected via a bus connection 34 to a bus input of programming release arrangement 30, as well as via a bus input of a first auxiliary memory 35. Enable interface signal ENI is transmitted via conductor 26 to an enabling input of shift register 29 and to a reset input of first auxiliary memory 35. Each of the outputs of shift register 29 belonging to bits TPRG and TPTC are transmitted to an input of an appertaining memory cell of a second auxiliary memory 36, whose output signal is TM1 or TM10. Before programming the value N, the signal ENI, transmitted from computer 22 to measuring device 1, has a logic value "0", which resets measuring device 1 to zero. Signals TM1 and TM10 are then both zero. At the beginning of programming, computer 22 sets signal ENI to logic value "1", so that modules 29 and 33 are enabled, and the counting process by counter 33 is started. Communications interface 23;24 receives the bits of data signal MOSI time-serially, and shifts them by means of interface clocking signal SCK into shift register 29, where they are put in intermediate storage. From the starting instant, counter 33 counts the periods of interface clocking signal SCK, enabled by the start logic, and produces an impulse at one of its outputs when data signal MOSI is shifted into shift register 29. This impulse is received at a load input LD of auxiliary memory 35, where it causes the five bits of digital equalization value N to be loaded from shift register 29 into auxiliary memory 35, and is also received at a clocking input of second auxiliary memory 36, where it causes the values of bits TPRG and TPTC to be loaded out of shift register 29 into their appertaining storage cells of auxiliary memory 36. A multi-bit switch-over switch 37 is provided to switch over the programming bus input 13 of reference voltage source 4 from the bus output 38a of a memory 38, which is preferably a non-volatile memory, to a bus output of first auxiliary memory 35. For this purpose, the latter bus output is connected via a bus connection 39 to five first inputs of multi-bit switch-over switch 37, while bus output 38a of memory 38 is connected via a bus connection 40 to five second inputs of multi-bit switch-over switch 37, whose output is connected via a bus connection 41 to programming bus input 13 of reference voltage source 4. Signal TM10 feeds a control input of multi-bit switch-over switch 37. Memory 38 is preferably a field-programmable read only memory (FPROM), or an electrically erasable programmable read only memory (EEPROM). Programming enable arrangement 30 contains an enabling gate 30a with more than N number of bits; i.e., a sixth enabling gate 30a for the appertaining memory cell of memory 38. Bit BTK, which is a disabling bit, is stored therein, and is in intermediate storage in shift register 29. All enabling gates 30a are, e.g., And gates. A parallel output of shift register 29 belonging to bit BTK is connected to a first input of the sixth enabling gate 30a of programming enable arrangement 30, whose second input is connected to an output of an And gate 42, and also to a first input of a disabling gate 43, while its output is connected to an input of the additionally appertaining storage cell of memory 38. An output of the latter is connected via an inverter 44 to a second input of disabling gate 43, in order to disable the other five enabling gates 30a of programming enable arrangement 30. For this purpose, the output of disabling gate 43 is connected to a programming input 30b of programming enable arrangement 30. The first inputs of the five other disabling gates 30a of programming enable arrangement 30 constitute the bus input of the latter, while the second inputs of these five disabling gates 30a are all connected to each other, and thus constitute the programming input 30b of programming enable arrangement 30. The outputs of the five enabling gates 30a constitute the bus output of programming enable arrangement 30, which is connected via a bus connection to a bus input of memory 38. Programming enable arrangement 30 thus serves to retransmit the values of the five bits of N, as well as those of disabling bit BTK, to memory 38 to be stored therein. Computer 22 feeds the programming impulse PRG via conductor 28 to a first input of And gate 42. Signal TM1 appears at the second input of And gate 42. Disabling gate 43 can be, e.g., an And gate.

If the value N is to be stored only temporarily, i.e., in the auxiliary memory 35, bit TPRG and signal TM1 each have a logic value "0", while Bit TPTC and signal TM10 each have a logic value "1". Signal TM10 switches over multi-bit switch-over switch 37, while signal TM1 disables And gate 42. The bus output of auxiliary memory 35 is then connected via switched-over multi-bit change-over switch 37 to programming bus input 13 of reference voltage source 4. The latter, and thereby also measuring device 1, work with the value N, which is stored temporarily in auxiliary memory 35. If, on the other hand, the value N is to be stored permanently in non-volatile memory 38, bit TPRG and signal TM1 each have a logic value "1", while bit TPTC and signal TM10 each have a logic value "0". Signal TM1 enables And gate 42, and multi-bit change-over switch 37 is not switched over. The bus output of non-volatile memory 38 is thus connected to the programming bus input 13 of reference voltage source 4. Once the logic value "1" of signal TM1 has enabled And gate 42, computer 22 transmits a short programming impulse PRG, with a duration of, e.g., 10 µs, which reaches the second inputs of enabling gate 30a of programming enable arrangement 30 via gates 42 and 43, causing the connected enabling gates 30a to be enabled for the duration of the programming impulse. This causes the five bits of value N to be loaded into memory 38, from where they reach programming bus input 13 of reference voltage source 4, via non-switched over multi-bit change-over switch 37. The latter, and thereby also measuring device 1, work in this case with the equalization value N stored in a non-volatile manner permanently in memory 38. Computer 22 terminates the program by switching the ENI signal back to zero, causing measuring device 1 to be reset to zero, so that And gate 42, among others, is again disabled for any further programming impulse PRG.

If the equalization value N stored in a non-volatile manner in memory 38 is sensed to be correct after programming, it must be made irrevocably permanent, so that it may not be changed later. For this purpose, a single programming cycle is carried out in a programming termination mode, in order to load a logic value "1" of disabling bit BTK into memory 38. In the programming termination mode, and once the value N has been stored in memory 38, signal MOSI, interface clocking signal SCK, enable interface signal ENI, as well as programming impulse PRG, are transmitted from computer 22 to measuring device 1. The five bits belonging to equalization value N, as well as bit TPTC of signal MOSI transmitted by computer 22, have a logic value "0", while bits TPRG and BTK have a logic value "1". Bit BTK is stored into memory 38 in the same manner as the storing of the bits of equalization value N. The brief programming impulse PRG transmitted by computer 22 enables, among other things, the sixth enabling gate 30a (of programming enable arrangement 30 belonging to disabling bit BTK) for the duration of the programming impulse. This causes the memory cell of memory 38 which belongs to disabling bit BTK to be programmed, and a logic value "1" is stored therein. The disabling bit BTK stored in memory 38 is finally used in order to permanently prevent further loading of memory 38, in that its logic value "1" permanently disables disabling gate 43 via inverter 44. As a result, no programming impulse PRG can reach programming input 30b, and therefore the contents of memory 38 can no longer be changed. Computer 22 ends the programming termination mode by resetting signal ENI to zero, causing measuring device 1 to be reset to zero. When measuring device 1 has been programmed permanently, it can be removed from the programming set-up and can be put to further use in a temperature-compensated state.

During programming, the output 1a (FIG. 1) of measuring device 1, at which reference voltage $U_{R,N,T}$ appears, is connected to an input of a voltage measuring device 45 (FIG. 3), which measures reference voltage $U_{R,N,T}$. The output of quantizer Q is connected to an input of an additional measuring device 46 (FIG. 3), which is a frequency measuring device which measures the median frequency $\overline{f_{N,T}}$. One digital bus output of each of measuring devices 45 and 46 is connected to a port C or D of computer 22.

By means of two-temperature measurements, one after the other in time, and in the indicated sequence, the parameters listed below are measured or computed by computer 22, whereby all measured and computed values are stored in computer 22:

The temperature-dependent reference voltage $U_{R,N,T}$ is measured at a reference temperature, e.g., $T_0=35°$ C., with a first equalization value, e.g., a minimal equalization value N=0, and a second equalization value, e.g., a maximum equalization value N=31, whereby the measured value is respectively $U_{R,0,35}$ or $U_{R,31,35}$.

The temperature-dependent reference voltage $U_{R,N,T}$ is measured at a second temperature, e.g., T1=85° C., with the first equalization value N=0 and the second equalization value N=31, whereby the measured value is respectively $U_{R,0,85}$ or $U_{R,31,85}$.

When the first equalization value N=0 and the second equalization value N=31, a value of the absolute temperature coefficient $a_{R,N}$ of temperature-dependent reference voltage $U_{R,N,T}$ is computed by means of the following equation:

$$a_{R,31} = [U_{R,31,85} - U_{R,31,35}]/\Delta T \qquad \text{(see [IV])}$$
or
$$a_{R,0} = [U_{R,0,85} - U_{R,0,35}]/\Delta T$$
since:
$$U_{R,N,85} = U_{R,N,35} + a_{R,N} \cdot \Delta T$$

Two parameters $\Delta a_R$ and $\Delta U_{R,35}$ are calculated by means of the following equations:

$$\Delta \alpha_R = [\alpha_{R,31} - \alpha_{R,0}]/\Delta N \qquad \text{[VIII]}$$

$$\Delta U_{R,35} = [U_{R,31,35} - U_{R,0,35}]/\Delta N \qquad \text{[IX]}$$

where:

$\Delta N=N=31$ is the difference between the two equalization values N=31 and N=0;

$a_{R,31}$ and $a_{R,0}$ are the two values of the absolute temperature coefficient $a_{R,N}$ of temperature-dependent reference voltage $U_{R,N,T}$ when the second equalization value N=31 or the first equalization value N=0, as well as $U_{R,31,35}$ and $U_{R,0,35}$ are two values of temperature-dependent reference voltage $U_{R,N,T}$ measured at reference temperature $T_0=35°$ C., and when the second equalization value N=31 or the first equalization value N=0.

The parameter $\Delta a_R$ represents the slope of the characteristic curve $a_{R,N}=a_{R,0}+\Delta a_R \cdot \Delta N$ (assumed to be linear), of absolute temperature coefficient $a_{R,N}$, as a function of equalization value N=$\Delta N$, while the parameter $\Delta U_{R,35}$ represents the slope of the characteristic curve of reference voltage $U_{R,N,35}$, (assumed to be linear), as a function of equalization value N.

A specific value of equalization value N required for temperature compensation is equal to a rounded off whole number $N_K$ determined as follows:

$$N_K=[\alpha_{R,0}-\alpha_{R,N,Soll} \cdot U_{R,0,35}/[\alpha_{R,N,Soll} \cdot \Delta U_{R,35} - \Delta \alpha_R] \qquad \text{[X]}$$

The value $N_K$ is therefore calculated by means of this equation and then rounded off to a whole number and entered into computer 22 for storage. The rounded-off value of N must be between 0 and 31 in the assumed example.

Formula [X], $\Delta N$ being equal to N, results from the resolution of N in the following equations:

$$\alpha_{R,N,Soll} = \alpha_{R,N} = a_{R,N}/U_{R,N,35} \qquad \text{(see [IVa])}$$
where
$$a_{R,31} = a_{R,0} + \Delta N \cdot \Delta a_R \qquad \text{(see [VIII])}$$
and
$$U_{R,31,35} = U_{R,0,35} + \Delta N \cdot \Delta U_{R,35} \qquad \text{(see [IX])}$$

During measurements, one of the equalization values N=0 or N=31 is transmitted as part of signal MOSI by computer 22, via communications interface 23;24 to measuring device 1, where the pertinent value of N is stored temporarily in auxiliary memory 35. This value of N is then transmitted via multi-bit change-over switch 37 (switched over by means of signal TM10) to programming bus input 13 to reference voltage source 4. Thus, the first or second equalization value appears at programming bus input 13 during measuring. Measuring devices 45 and 46 then measure the values $U_{R,0,35}$, $U_{R,31,35}$, $U_{R,0,85}$ and $U_{R,31,85}$ and $\overline{f_{0,35}}$ and $\overline{f_{0,85}}$ respectively. The measured values go to computer 22 via ports C and D, and are stored there for further computation purposes. The computation and equalization are preferably carried out at a reference temperature $T_0=35°$ C.

In short, a temperature compensation circuit is disclosed with particular application to energy and power measuring devices. Moreover, the disclosed circuit can be individually programmed to accommodate variations in temperature coefficient characteristics.

The above described embodiments of the invention are intended to be illustrative only. Numerous alternative embodiments may be devised by those skilled in the art without departing from the spirit and scope of the following claims.

We claim:

1. A temperature compensation circuit for a power measuring device within a common temperature environment, comprising:

a sensor having a first temperature-dependent transmission factor $K_{H,T}$, for receiving an input voltage signal u[t] and an input current signal i[t], and for outputting a voltage signal $U_H$[t] which is proportional to the product of said u[t] and i[t] signals, a signal processor having a second temperature-dependent transmission factor $K_{S,T}$, for receiving at a first input said voltage signal $U_H$[t], and for outputting a signal representing a median value of said voltage signal $U_H$[t], and therefore, a median value of said product of said u[t] and i[t] signals, a reference voltage source for generating a temperature-dependent reference voltage $U_{R,N,T}$, and for outputting said reference voltage $U_{R,N,T}$ to a second input of said signal processor, wherein said signal processor second temperature-dependent transmission factor $K_{S,T}$ is inversely proportional to said reference voltage $U_{R,N,T}$, and wherein said median value output signal from said signal processor is rendered independent of temperature change in said temperature environment when a first temperature coefficient value of said reference voltage $U_{R,N,T}$ is equal to the sum of a second temperature coefficient value of said sensor first transmission factor $K_{H,T}$ and a third temperature coefficient value of said signal processor second transmission factor $K_{S,T}$.

2. The temperature compensation circuit of claim 1 wherein said first temperature coefficient value of said reference voltage $U_{R,N,T}$ is a predetermined value for said temperature compensation circuit.

3. The temperature compensation circuit of claim 2 wherein said first temperature coefficient value is programmed into said temperature compensation circuit with a previously stored value N.

4. The temperature compensation circuit of claim 3 wherein said reference voltage source comprises a first transistor having a negative temperature coefficient base-emitter voltage, a resistor network, connected in series with said first transistor, said resistance network having a current flow with a positive temperature coefficient, such that a part of said temperature-dependent reference voltage $U_{R,N,T}$ is generated across a portion of said resistor network, and wherein said temperature-dependent reference voltage $U_{R,N,T}$ has a temperature coefficient value equal to said first temperature coefficient value.

5. The temperature compensation circuit of claim 4 wherein said reference voltage source further comprises a second and a third transistor, connected in a differential circuit with a first current source and a second current source, such that a difference between base-emitter voltages of said second and third transistors provides a bias voltage across a portion of said resistor network, which is connected to said second current source, producing said current flow with a positive temperature coefficient through said resistor network.

6. The temperature compensation circuit of claim 5 wherein said portion of said resistor network is variable and comprises a digital trimming potentiometer with trim values adjustable to said stored value N.

7. The temperature compensation circuit of claim 6 wherein said resistor network further comprises a resistor connected to said first transistor such that a temperature-independent voltage is generated across the series combination of said resistor and said first transistor.

8. The temperature compensation circuit of claim 3 wherein said stored value N is equal to a rounded off whole number $N_K$ determined by the following equation:

$$N_K = [a_{R,0} - \alpha_{R,N,Soll} U_{R,0,35}] / [\alpha_{R,N,Soll} \Delta U_{R,35} - \Delta a_R]$$

where $a_{R,0} = [U_{R,0,85} - U_{R,0,35}]/\Delta T$, $\alpha_{R,N,Soll}$ is said first temperature coefficient value, $U_{R,0,35}$ is a value of said temperature-dependent reference voltage $U_{R,N,T}$ measured at a reference temperature $T_0 = 35°$ C., and with a first equalization value N=0, $\Delta U_{R,35} = [U_{R,31,35} - U_{R,0,35}]/\Delta N$, $\Delta a_R = [a_{R,31} - a_{R,0}]/\Delta N$, $a_{R,31} = [U_{R,31,85} - U_{R,31,35}]/\Delta T$, $U_{R,31,35}$ is a value of said temperature-dependent reference voltage $U_{R,N,T}$ measured at said reference temperature $T_0 = 35°$ C., and with a second equalization value N=31, $U_{R,0,85}$ is a value of said temperature-dependent reference voltage $U_{R,N,T}$ measured at a second temperature $T_0 = 85°$ C., and with said first equalization value N=0, $U_{R,31,85}$ is a value of said temperature-dependent reference voltage ($U_{R,N,T}$) measured at said second temperature ($T_0 = 85°$ C.) and with said second equalization value (N=31), $\Delta N$ is a difference between said first and second equalization values N=0 and N=31, respectively, and $\Delta T$ is a difference ($T_1 - T_0$) between said reference and said second temperatures $T_0$ and $T_1$, respectively.

9. A method for temperature compensating a power measurement within a common temperature environment, comprising the following steps:

sensing an input power signal with a sensor having a first temperature-dependent transmission factor, outputting a voltage signal from said sensor which is proportional to said input power signal, inputting said voltage signal to a signal processor having a second temperature-dependent transmission factor, generating a reference voltage from a reference voltage source wherein said reference voltage is inversely proportional to said signal processor second temperature-dependent transmission factor, and said reference voltage having a first temperature coefficient value, inputting said reference voltage to said signal processor, outputting a signal from said signal processor which represents a median value of said voltage signal proportional to said input power signal, wherein said median value output signal is rendered independent of temperature change in said temperature environment when said first temperature coefficient value of said reference voltage is equal to the sum of a second temperature coefficient value of said sensor first transmission factor and a third temperature coefficient value of said signal processor second transmission factor.

10. The method of claim 9 wherein said first temperature coefficient value of said reference voltage is a predetermined programmable value.

11. A digitally programmable temperature compensated measurement system comprising:

a computer for outputting digital control signals, an interface logic circuit for receiving said control signals and for outputting command signals, memory circuits for receiving and storing said command signals, and for outputting said command signals, a switching circuit for receiving said command signals outputted from said memory circuits, and for selectively outputting said command signals, a reference voltage source for receiving said command signals from said switching circuit, and for generating a temperature-dependent reference voltage having a first temperature coefficient value as determined by one of said command signals, a sensor for receiving a signal to be measured, said sensor having a temperature-dependent first transmission factor with a second temperature coefficient value, said sensor outputting a signal proportional to said signal to be measured, a signal processor for receiving said sensor output signal and said reference voltage, and for outputting a signal representing a median value of said signal to be measured, said signal processor having a temperature-dependent second transmission factor with a third temperature coefficient value, said second transmission factor being inversely proportional to said reference voltage, wherein said median value output signal is rendered independent of temperature change when said first temperature coefficient value of said reference voltage is equal to the sum of said second temperature coefficient value of said sensor first transmission factor and said third temperature coefficient value of said signal processor second transmission factor, and wherein said reference voltage source, said sensor, and said signal processor are all within a common temperature environment.

* * * * *